(12) United States Patent
Chen

(10) Patent No.: US 7,141,782 B2
(45) Date of Patent: Nov. 28, 2006

(54) IMAGE SENSOR WITH PROTECTIVE PACKAGE STRUCTURE FOR SENSING AREA

(75) Inventor: Wen-Ching Chen, Dali (TW)

(73) Assignees: Exquisite Optical Technology, Ltd., Taichung (TW); Wen-Ching Chen, Taichung (TW)

( * ) Notice: Subject to any disclaimer, the term of this patent is extended or adjusted under 35 U.S.C. 154(b) by 67 days.

(21) Appl. No.: 10/851,121

(22) Filed: May 24, 2004

(65) Prior Publication Data

US 2005/0258336 A1    Nov. 24, 2005

(51) Int. Cl.
*H01J 5/02* (2006.01)
*H01J 40/14* (2006.01)

(52) U.S. Cl. ...................... 250/239; 257/434
(58) Field of Classification Search ............... 250/239, 250/208.1, 214.1, 214 R, 216; 257/434, 257/290, 291, 294, 440, 433, 435, 81, 82, 257/84, 778; 438/108, 125

See application file for complete search history.

(56) References Cited

U.S. PATENT DOCUMENTS 5,352,852 A * 10/1994 Chun ........................ 257/680
5,969,461 A * 10/1999 Anderson et al. ........... 174/260
6,368,898 B1* 4/2002 Nakada ...................... 438/123

* cited by examiner

*Primary Examiner*—Thanh X. Luu
*Assistant Examiner*—Suezu Ellis
(74) *Attorney, Agent, or Firm*—Rosenberg, Klein & Lee

(57) ABSTRACT

An image sensor with a protective package structure for the sensing area is provided. The image sensor includes a transparent substrate and a semiconductor image-sensing chip. A conductive interconnection circuit is formed on at least the lower surface of the transparent substrate. The semiconductor image-sensing chip is electrically connected with the electric interconnection circuit of the substrate. A perimeter of the chip is underfilled with gum material. A dike is formed around the image-sensing area of the semiconductor image-sensing chip. The electric contact of the semiconductor image-sensing chip is positioned on outer side of the dike.

6 Claims, 6 Drawing Sheets

IMAGE SENSOR WITH PROTECTIVE PACKAGE STRUCTURE FOR SENSING AREA

BACKGROUND OF THE INVENTION

The present invention is related to an image sensor with a protective package structure for a sensing area, and more particularly to an image sensor with a flip chip package in which a dike is formed around the image-sensing area of the chip for isolating the image-sensing area from contamination and scattering light beam.

It is a trend to use flip chip packaging. In such a manufacturing procedure, bumps are formed on the wafer. Then, after being cut into units, the units are loop soldered with the circuit contact on the substrate. This can achieve a minimum package volume for the size of chip. In addition, the chip can directly radiate heat. Accordingly, the flip chip package meets the requirement of miniaturization for current electronic products.

FIG. 10 shows a conventional flip chip package structure for an image sensor. A conductive interconnection circuit 81 is formed on the lower face of a glass substrate 80. Multiple solder pads are disposed on the chip of a semiconductor image sensor. By means of thermopressing or loop soldering, via tin balls 82 or bumps, the solder pads are electrically connected with the circuit contacts of the conductive interconnection circuit 81. The perimeter of the chip are underfilled with gum material 83 for obtaining an airtight effect. A tin ball is implanted in each circuit contact of the peripheral area of the glass substrate for adhering to the surface of the circuit board. The above arrangement has some shortcomings as follows:

1. The underfilled gum material infiltrates into the gap between the chip and the glass substrate by means of capillary action. In cases where the gum material is not properly controlled, the image sensing area of the chip may be partially or totally covered by the gum material. This will affect the optical path of the image projected to the image sensing area. As a result, the sensed image will be fogged.
2. Light can still pass through the glass substrate outside the perimeter of the image sensing area of the chip as shown in FIG. 11. However, the picked up image light beams T1, T2 are partially reflected by the surface of the chip and fully reflected by the lower surface of the glass substrate and then projected to the image sensing area. This will interfere with the image sensed around the image sensing area.
3. In the case where the image sensing area the chip is associated with the glass substrate by means of tin paste loop soldering or lead/tin bumps, a flux is often painted on the soldered surface. At this time, the gas of the volatile solvent of the flux when exposed to high temperatures will partially escape into the image sensing area. This will contaminate or vaporize the image sensing area. As a result, the quality of the picked up image will be directly affected.

SUMMARY OF THE INVENTION

It is therefore a primary object of the present invention to provide an image sensor with flip chip package in which the image-sensing area of the chip is isolated from the solder pad area so as to isolate the image-sensing area from contamination and scattering light beam.

According to the above object, the image sensor includes: a transparent substrate having an upper surface and a lower surface, a conductive interconnection circuit being formed on at least the lower surface of the transparent substrate; and a semiconductor image-sensing chip. An upper surface of the chip is electrically connected with the electric interconnection circuit of the lower surface of the substrate. A perimeter of the chip is underfilled with gum material. A dike is formed around the image-sensing area of the semiconductor image-sensing chip. The electric contact of the semiconductor image-sensing chip is positioned on outer side of the dike.

The present invention can be best understood through the following description and accompanying drawings wherein:

DETAILED DESCRIPTION OF THE PREFERRED EMBODIMENTS

Figure 1:
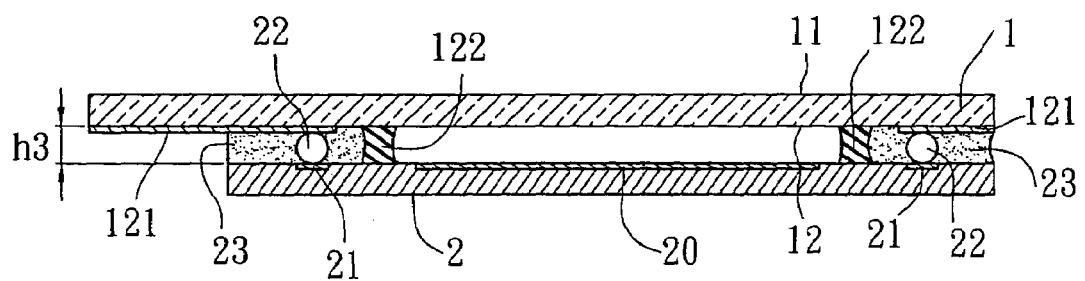
FIG. 1 is a sectional view of the image sensor with flip chip package of the present invention.
Figure 2:
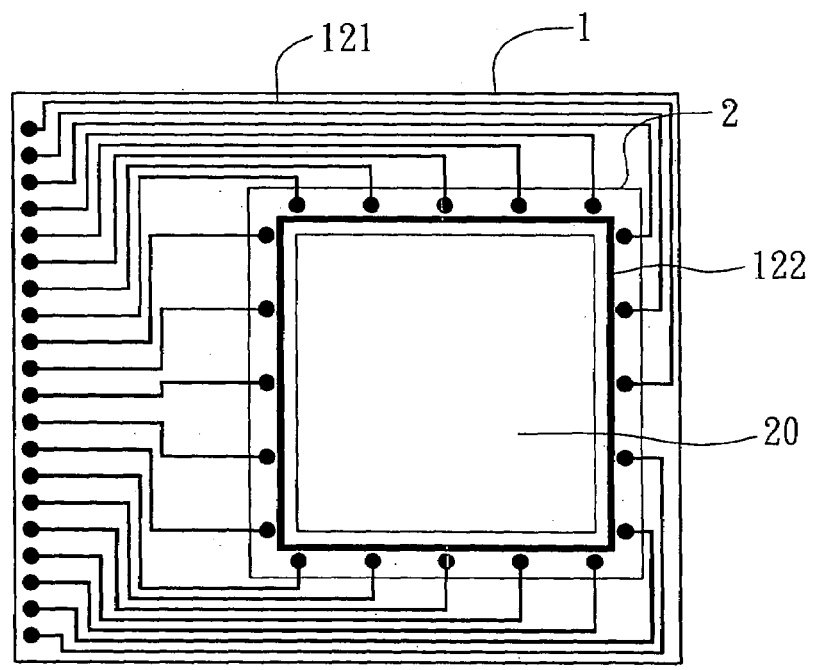
FIG. 2 is a top view of the image sensor with flip chip package of the present invention according to FIG. 1.
Figure 3:
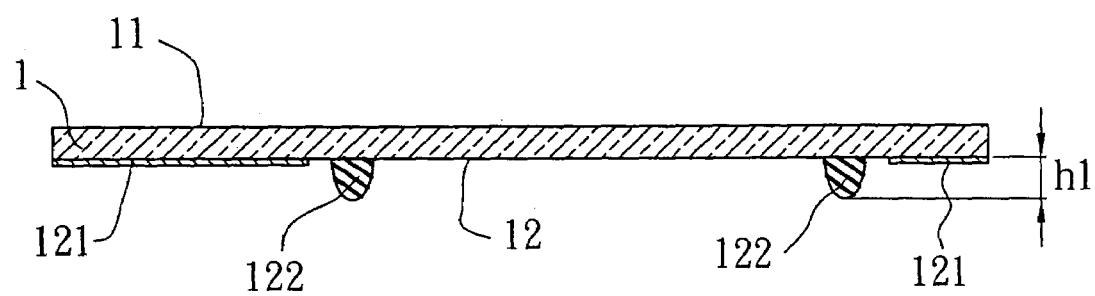
FIG. 3 shows that the dike is formed on lower surface of the transparent substrate of the present invention.

Please refer to FIGS. 1 and 2. The image sensor of the present invention includes a transparent substrate 1 having an upper surface 11 and a lower surface 12. A conductive interconnection circuit 121 and a frame-shaped dike 122 are formed on at least the lower surface of the transparent substrate as shown in FIG. 3.

The dike is made by means of one of the following measures:

1. The dike is painted on a predetermined position of the lower surface of the transparent substrate by way of halftone printing.
2. The dike is painted on a predetermined position of the lower surface of the transparent substrate by way of point gluing.
3. The dike is formed on a predetermined position of the lower surface of the transparent substrate by way of injection molding.

Figure 4:
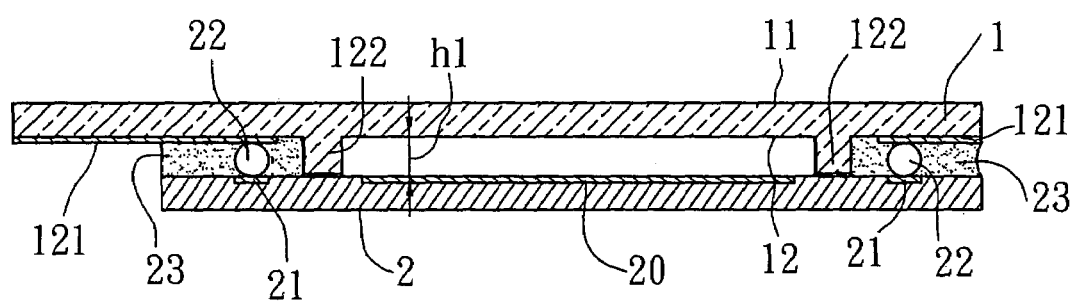
FIG. 4 shows that the dike is integrally molded on the transparent substrate of the image sensor of the present invention.
Figure 5:
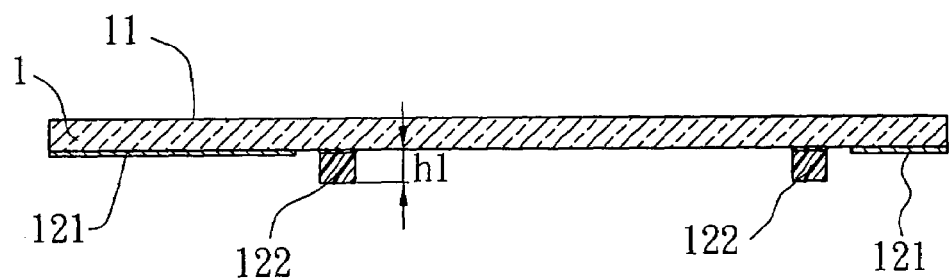
FIG. 5 shows that the dike is previously molded and then adhered to a predetermined position of the surface of the transparent substrate of the present invention.

4. The dike is formed on a predetermined position of the surface of the transparent substrate by way of sedimentation.
5. The dike is integrally formed on the transparent substrate by way of injection molding as shown in FIG. 4.
6. The dike is previously formed as an independent frame body by injection molding and then adhered to a predetermined position of the surface of the transparent substrate as shown in FIG. 5.

The material of the dike is selected among UV gum, epoxy, rubber, plastic and any other nonconductive materials.

The present invention further includes a semiconductor image-sensing chip 2. Solder pads 21 are disposed on upper surface of the chip 2 and electrically connected with the electric interconnection circuit of the lower surface of the substrate. In this embodiment, the solder pads 21 are electrically connected with the electric interconnection circuit by means of tin balls 22. Then, according to the manufacturing method of the dike, a solidifying procedure is performed. For example, with respect to the first and second manufacturing methods, in the case where the dike is made of UV gum, the present invention is exposed to UV rays and quickly solidified. Finally, the perimeter of the chip is underfilled with gum material 23 to achieve an image sensor with flip chip package. The image-sensing chip has a dike around the sensing area 20. The solder pads 21 and tin balls 22 are positioned on outer side of the dike.

According to another embodiment of the present invention, the dike 24 is arranged around the image-sensing area 20 of the semiconductor image-sensing chip.

Figure 6:
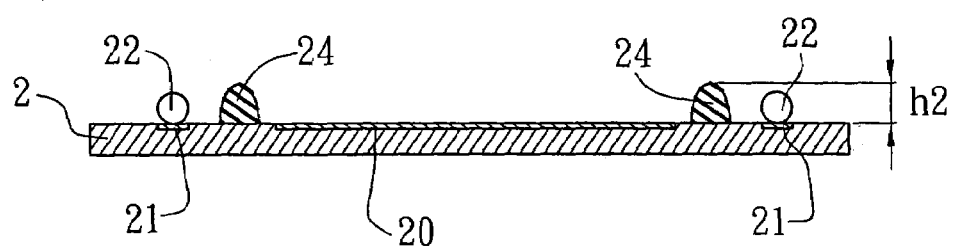
FIG. 6 shows that the dike is formed around the image-sensing area of the semiconductor image-sensing chip of the present invention.
Figure 7:
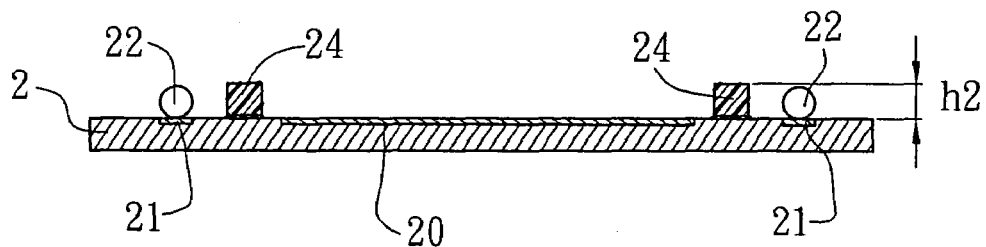
FIG. 7 shows that the dike is formed on a predetermined position of the surface of the semiconductor image-sensing chip of the present invention by way of sedimentation.
Figure 8:
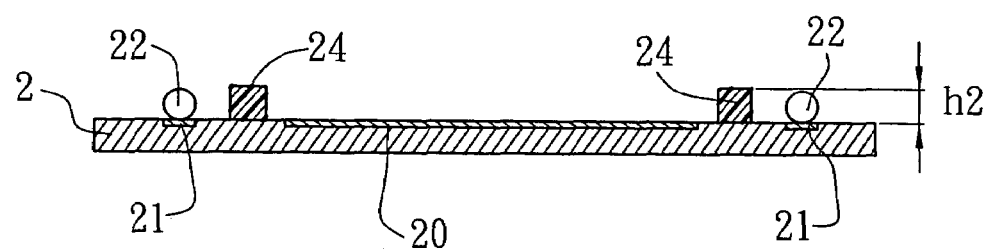
FIG. 8 shows that the dike is previously molded and then adhered to a predetermined position of the surface of the semiconductor image-sensing chip of the present invention.

The dike is made by means of one of the following measures:
1. The dike is painted on a predetermined position of the surface of the outer circumference of the image-sensing area of the semiconductor image-sensing chip by way of halftone printing as shown in FIG. 6.
2. The dike is painted on a predetermined position of the surface of the outer circumference of the image-sensing area of the semiconductor image-sensing chip by way of point gluing as shown in FIG. 6.
3. The dike is formed on a predetermined position of the surface of the outer circumference of the image-sensing area of the semiconductor image-sensing chip by way of sedimentation as shown in FIG. 7.
4. The dike is previously formed as an independent frame body by injection molding and then adhered to a predetermined position of the surface of the outer circumference of the image-sensing area of the semiconductor image-sensing chip as shown in FIG. 8.

The material of the dike is selected among UV gum, epoxy, rubber, plastic and any other nonconductive materials.

In the above two embodiments of the image sensor, the heights h1, h2 of the dike are at least equal to the gap h3 between the semiconductor image-sensing chip and the lower surface of the transparent substrate with which the semiconductor image-sensing chip is electrically connected. After packaged, the upper end of the dike abuts against the lower surface of the transparent substrate to achieve best protective effect.

According to the design of the present invention, the sensing area of the image-sensing chip is isolated by the circumferential dike. The solder pads of the semiconductor image-sensing chip are positioned on outer side of the dike. Therefore, during the successive manufacturing procedure such as tin ball loop soldering, the generated gas of the volatile solvent of the flux is totally prevented from entering the image-sensing area. In addition, when underfilling the gum material, the escaping gum material is also stopped by the dike from entering the image-sensing area. Therefore, the image-sensing area can keep clean.

Figure 9:
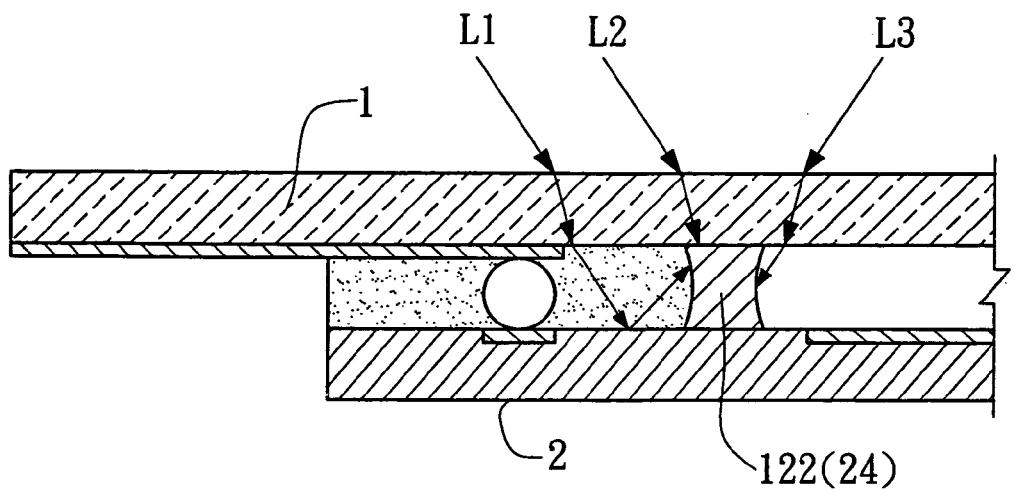
FIG. 9 shows the optical path of the image sensor with flip chip package of the present invention.
Figure 10:
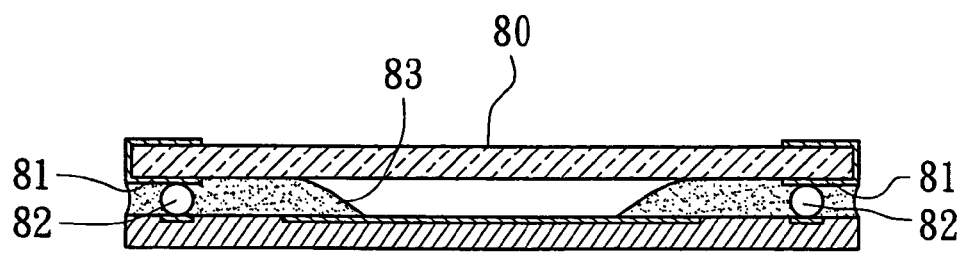
FIG. 10 is a sectional view of a conventional image sensor with flip chip package.
Figure 11:
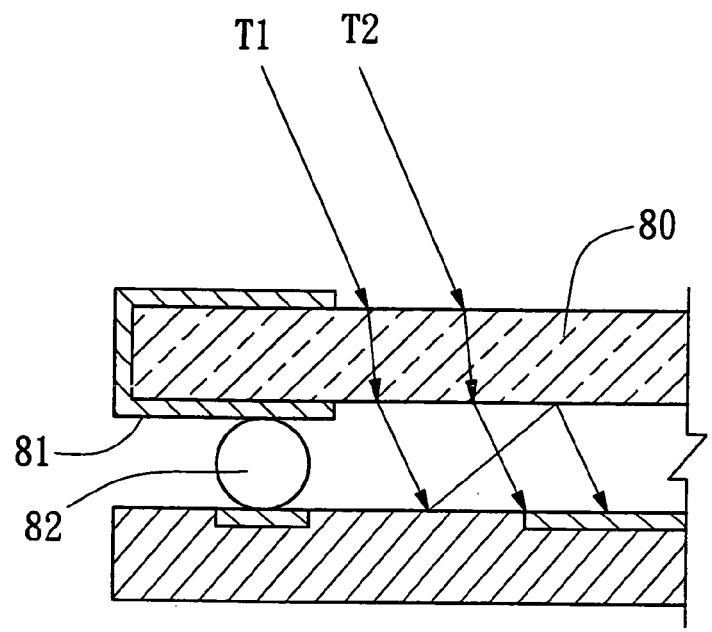
FIG. 11 shows the optical path of the conventional image sensor with flip chip package.

On the other hand, as shown in FIG. 9, in the case where the dike is made of black or nonreflective material, the received image light beams L1; L2 will pass through the glass substrate and then project outside the perimeter of the image-sensing area. The light beams are reflected by the surface of the chip and obstructed by the dike. Therefore, the image sensed at the perimeter of the image-sensing area will not be disturbed. Similarly, the received image light beam L3 passes through the, glass substrate and then projects onto the dike. Therefore, in the case where the dike is made of a nonreflective material, the light beam L3 is impeded from being reflected to the image-sensing area.

The above embodiments are only used to illustrate the present invention, not intended to limit the scope thereof. Many modifications of the above embodiments can be made without departing from the spirit of the present invention.

What is claimed is:

1. An image sensor with a protective package structure for a sensing area, said image sensor comprising:
   a transparent substrate having an upper surface and a lower surface, a conductive interconnection circuit being formed on at least the lower surface of the transparent substrate;
   a semiconductor image-sensing chip having an upper surface being electrically connected with the electric interconnection circuit of the lower surface of the substrate, a perimeter of the semiconductor image-sensing chip being underfilled with a gum material; and,
   a dike disposed around a perimeter of the image-sensing area of the semiconductor image-sensing chip and positioned between the substrate and the semiconductor image-sensing chip, an electric contact of the semiconductor image-sensing chip being positioned on an outer side of the dike, the dike having a surface that is black or nonreflective to inhibit secondary reflections therefrom.

2. The image sensor with a protective package structure for a sensing area as claimed in claim 1, wherein the dike is formed on lower surface of the transparent substrate.

3. The image sensor with a protective package structure for a sensing area as claimed in claim 1, wherein the dike is painted on a predetermined position of the lower surface of the transparent substrate by halftone printing.

4. The image sensor with a protective package structure for a sensing area as claimed in claim 1, wherein the dike is painted on a predetermined position of the lower surface of the transparent substrate by point gluing.

5. An image sensor with a protective package structure for a sensing area comprising:
   a transparent substrate having an upper surface and a lower surface, a conductive interconnection circuit being formed on at least the lower surface of the transparent substrate; and
   a semiconductor image-sensing chip, an upper surface of the semiconductor image-sensing chip being electrically connected with the electric interconnection circuit of the lower surface of the substrate, a perimeter of the semiconductor image-sensing chip being underfilled with a gum material, the image-sensing chip having a dike formed thereon circumscribing the image-sensing area thereof, the dike being formed by halftone printing, an electric contact of the semiconductor image-sensing chip being positioned on an outer side of the dike.

6. An image sensor with a protective package structure for a sensing area comprising:
- a transparent substrate having an upper surface and a lower surface, a conductive interconnection circuit being formed on at least the lower surface of the transparent substrate; and
- a semiconductor image-sensing chip, an upper surface of the semiconductor image-sensing chip being electrically connected with the electric interconnection circuit of the lower surface of the substrate, a perimeter of the semiconductor image-sensing chip being underfilled with a gum material, the image-sensing chip having a dike formed thereon circumscribing the image-sensing area thereof, the dike being formed by point gluing, an electric contact of the semiconductor image-sensing chip being positioned on an outer side of the dike.

* * * * *